United States Patent

Hasegawa et al.

(10) Patent No.: US 10,014,637 B2
(45) Date of Patent: Jul. 3, 2018

(54) CONNECTOR RECEPTACLE INTERFACING CIRCUIT AND METHOD OF OPERATION

(71) Applicant: Sony Mobile Communications Inc., Tokyo (JP)

(72) Inventors: Hiroyuki Hasegawa, Tokyo (JP); Mikio Daigo, Tokyo (JP); Kazuhiro Kuroda, Tokyo (JP); Hiroki Nitta, Tokyo (JP)

(73) Assignee: Sony Mobile Communications Inc., Tokyo (JP)

( * ) Notice: Subject to any disclaimer, the term of this patent is extended or adjusted under 35 U.S.C. 154(b) by 304 days.

(21) Appl. No.: 14/918,237

(22) Filed: Oct. 20, 2015

(65) Prior Publication Data

US 2017/0110835 A1    Apr. 20, 2017

(51) Int. Cl.
*G01R 19/00* (2006.01)
*H01R 13/66* (2006.01)
*H01R 13/70* (2006.01)
*G01R 19/165* (2006.01)
*G06F 13/40* (2006.01)
*H04M 1/02* (2006.01)
*H01R 24/60* (2011.01)
*H01R 107/00* (2006.01)

(52) U.S. Cl.
CPC ... *H01R 13/6683* (2013.01); *G01R 19/16528* (2013.01); *G06F 13/4081* (2013.01); *H04M 1/0274* (2013.01); *G01R 19/0046* (2013.01); *H01R 24/60* (2013.01); *H01R 2107/00* (2013.01)

(58) Field of Classification Search
None
See application file for complete search history.

(56) References Cited

U.S. PATENT DOCUMENTS

2006/0058069 A1* 3/2006 Garcia .............. H04B 1/3833
455/567
2007/0247373 A1* 10/2007 Egorov .............. H01Q 1/243
343/702

(Continued)

FOREIGN PATENT DOCUMENTS

EP    2 860 642 A1   4/2015
JP    2006-147259    6/2006

OTHER PUBLICATIONS

Extended European Search Report dated Jun. 27, 2017 in European Patent Application No. 16161112.4.

*Primary Examiner* — Jared Fureman
*Assistant Examiner* — Joel Barnett
(74) *Attorney, Agent, or Firm* — Oblon, McClelland, Maier & Neustadt, L.L.P.

(57) ABSTRACT

A device is equipped with an electrical connector in the form of a receptacle that is subject to liquid intrusion. The device detects the insertion of a mating connector and optionally detects the presence of liquid in the receptacle by applying a low power, pulsed sense signal to a terminal pin of the receptacle while the terminal pin is decoupled from a circuit part to which the terminal pin is normally coupled and concurrently sensing a voltage coupled from the terminal pin and comparing the voltage to at least a predetermined lower voltage bound and optionally a predetermined upper voltage bound and based on the results of those comparison deduces the presence of a mating connector or optionally the presence of liquid in the receptacle.

20 Claims, 8 Drawing Sheets

(56) References Cited

U.S. PATENT DOCUMENTS

2014/0218045 A1\* 8/2014 Shoykhet ............ G06F 13/4081
  324/538
2015/0106544 A1   4/2015 Leinonen et al.
2015/0261714 A1\* 9/2015 Talmola .............. G06F 13/4081
  710/313

\* cited by examiner

| A1 | A2 | A3 | A4 | A5 | A6 | A7 | A8 | A9 | A10 | A11 | A12 |
|---|---|---|---|---|---|---|---|---|---|---|---|
| GND1 | TX1+ | TX1− | $V_{BUS}$ | CC1 | D+ | D− | SBU1 | $V_{BUS}$ | RX2− | RX2+ | GND2 |

| GND3 | RX1+ | RX1− | $V_{BUS}$ | SBU2 | D− | D+ | CC2 | $V_{BUS}$ | TX2− | TX2+ | GND4 |
|---|---|---|---|---|---|---|---|---|---|---|---|
| B12 | B11 | B10 | B9 | B8 | B7 | B6 | B5 | B4 | B3 | B2 | B1 |

CONNECTOR RECEPTACLE INTERFACING CIRCUIT AND METHOD OF OPERATION

FIELD OF THE DISCLOSURE

This specification is related to interfacing between electrical plugs and mating receptacles. More particularly this specification is related to Universal Serial Bus Type-C plug and receptacle interfacing.

BACKGROUND

Terminal devices such as smartphones and tablet computers are typically provided with Universal Serial Bus (USB) receptacles. USB receptacles and compatible USB plugs are used to interface to a wide variety of equipment including, for example, laptop computers, printers, data acquisition equipment, cameras, flash memory drives, smartphones, feature phones, desktop computers, music players, game consoles and game controllers. A cable having USB plugs at both ends is used to facilitate connections between two different devices equipped with USB receptacles.

The latest iteration of the USB standard is called USB Type-C. The USB Type-C standard affords higher speed data transfer. The USB Type-C standard also includes a new horizontally and vertically symmetric connector design and a 180° rotationally symetric pin layout so that the connector can be inserted either of two ways, i.e., right-side-up or upside-down. Incidently a USB Type-C cable uses the same style of plug on both ends.

Among the pins defined in the USB Type-C standard is a Configuration Channel (CC) terminal pin. The CC terminal pin is used to detect insertion of plug (attached to a cable attached to another device) into a receptacle and for hand shaking. Per the USB Type-C standard a host device equipped with a USB Type-C receptacle periodically sends out a pulse on the CC terminal pin of the USB Type-C receptacle to probe for the presence of a connected plug. When a plug that is connected to a cable that is connected to a second device is inserted into the USB Type-C receptacle a USB Type-C controller in the second device will detect the pulse on the CC terminal pin and communication between the host device and the second device will be initiated.

Certain host devices that will include the USB Type-C receptacle will be designed to be waterproof However an issue arises if electricaly conductive liquid (e.g., juice, seawater) gets into and stays in a receptacle conforming to the USB Type-C standard. Over a long period of time, the aforementioned periodic pulse sent out on the CC terminal pin can drive an electrochemical corrosion reaction on pins of the receptacle. It has been confirmed experimentally that corrosion occurs if a USB Type-C is left operating for several days with water in it.

One way to address the corrosion problem would be to provide a water tight cap that goes over the receptacle. However it is somewhat inconvenient to remove and replace the cap and the cap can get lost.

It would be desirable to eliminate the problem of electrochemical corrosion driven by the CC terminal pulse signals.

SUMMARY

According to certain embodiments, outputting a relatively higher average power level handshaking signal from a first electrical connector (e.g., receptacle) is conditioned on detecting a mating second connector and detection of the second mating conductor is achieved by outputting a relatively lower average power level detection signal from the first electrical connector and sensing a voltage level which is dependent on the presense or absence of the second mating connector.

According to certain embodiments, the first electrical connector is a receptacle that is compatible with USB Type-C plugs, the second mating connector is a USB Type-C plug, the relatively higher average power level handshaking signal is a CC terminal pin pulse signal, and the relatively lower average power level signal is output on the USB Type-C ground terminal while the ground terminal has been decoupled from an associated ground plane.

According to certain embodiments, the relatively lower average power signal has a duration that is less than $\frac{1}{100}$ of the duration of the handshaking signal.

According to certain embodiments, the relatively lower average power signal has a peak voltage that is less than $\frac{1}{3}$ of a voltage of the handshaking signal.

According to certain embodiments, the relatively lower average power signal has a duration that is less than $\frac{1}{100}$ of the duration of the handshaking signal and has a voltage that is less than $\frac{1}{3}$ of the voltage of the voltage of the handshaking signal The full set or any subset of the the features mentioned above in this summary can be used together per certain embodiments.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
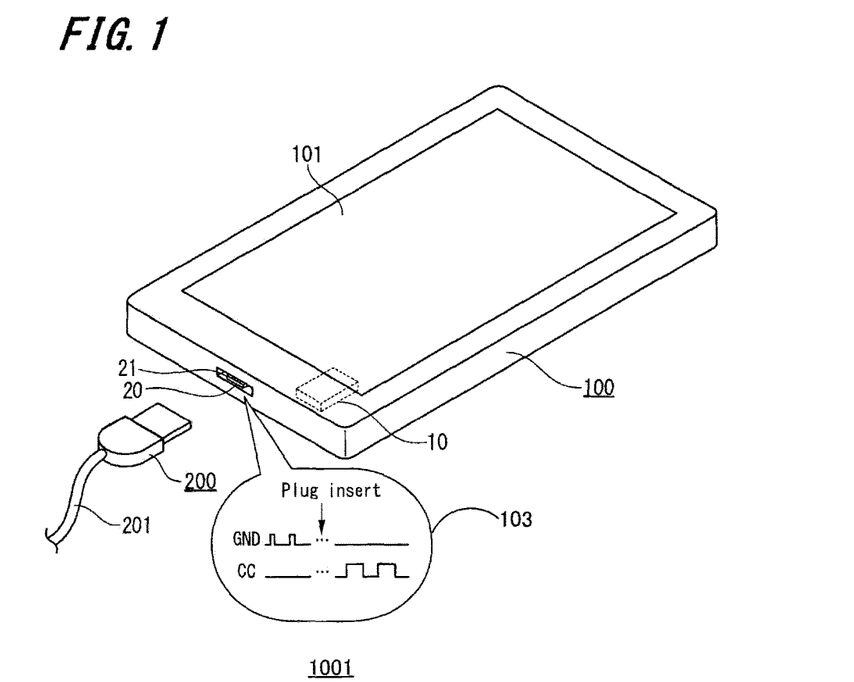
FIG. 1 is a perspective view of a system including a device equipped with a receptacle and a mating plug according to an exemplary embodiment of the disclosure.
Figure 3:
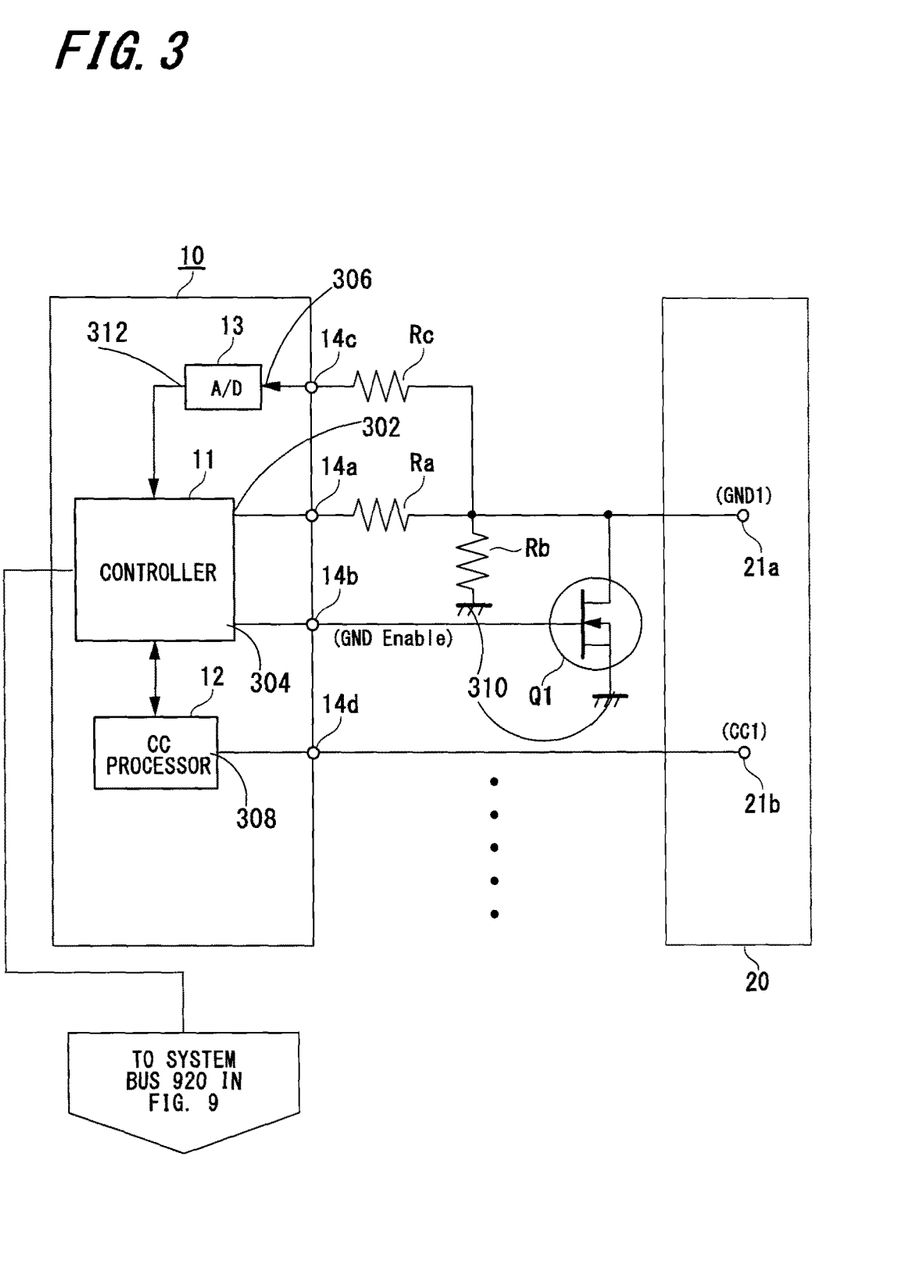
FIG. 3 is an electrical schematic showing elements of an interface between the receptacle and plug shown in FIGS. 1-2 according to an exemplary embodiment of the disclosure.
Figure 6:
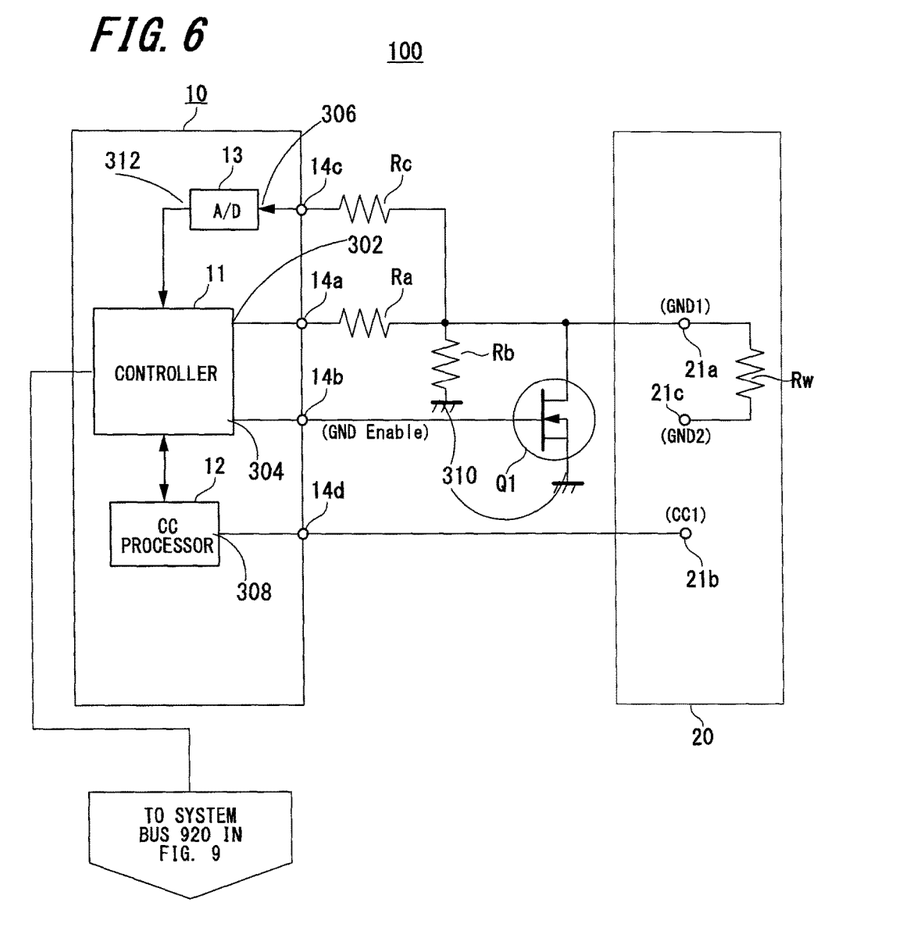
FIG. 6 is a block diagram of the device shown in FIG. 1 including a modified version of FIG. 3 depicting a state in which a liquid with a finite conductivity has intruded inside the receptacle.
Figure 9:
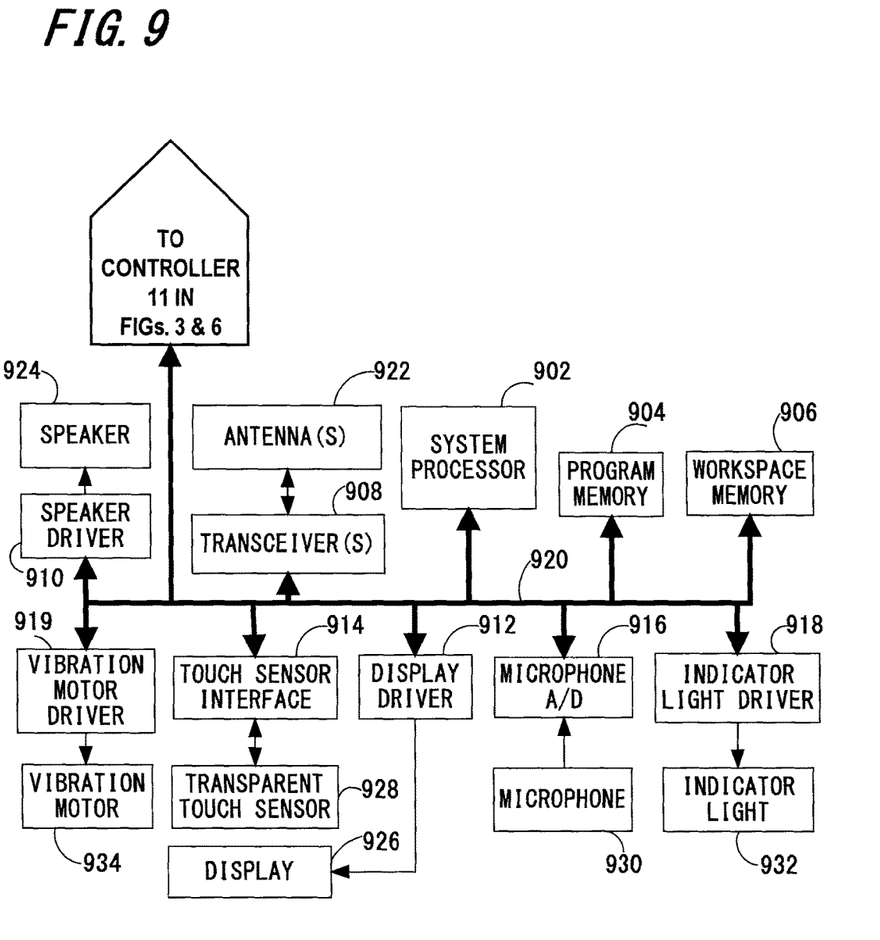
FIG. 9 is a block diagram of parts of circuitry of the device shown in FIG. 1.

Referring now to the drawings, wherein like reference numerals designate identical or corresponding parts throughout the several views FIG. 1 is a perspective view of a system 1001 including a device 100 equipped with a receptacle 20 and a mating plug 200 according to an exemplary embodiment of the disclosure. As shown in FIG. 1 the device 100 is in the form of a tablet computer, however, alternatively the device 100 can be another type of device, such as, for example, a smartphone, a feature phone, a laptop computer, a desktop computer, a camera, a music player, a game console or a game controller. According to certain embodiments of the disclosure the receptacle 20 is compatible with USB Type-C plugs, and the mating plug 200 is a USB Type-C plug. A cable 201 is electrically connected to and extends from the mating plug 200. A second end of the cable (not shown) includes a second USB Type-C plug (not shown) for connecting to a second device (not shown). The receptacle 20 includes a substrate 21 on which a set of terminal "pins" (not visible in FIG. 1) are formed. The pins can take the form of metalized areas on the substrate 21. The terminal pins of the receptacle 20 include the CC terminal pin 21*b* (FIG. 3) discussed in the background section, a first ground terminal pin (GND1) 21*a* (FIG. 3) and a second ground terminal pin GND2 (FIG. 6). The device 100 includes a communication interface circuit 10 that is electrically coupled (e.g., via a common printed circuit board, not shown) to the receptacle 20. Incidentally, the device 100 also includes a touch screen 101. The touch screen 101 is one form of a user interface output. The device 100 can also include other types of user interface outputs, such as for example a speaker 924 (FIG. 9), an indicator light 932 (FIG. 9) and/or a vibratory alert 919, 934 (FIG. 9). An explanatory bubble 103 depicts (not to scale) signals that are output by the CC terminal pin 21*b* (FIG. 3) and the GND pin 21*a* (FIG. 3).

When the plug 200 is inserted into the receptacle 20 the communication interface circuit 10 outputs a series of pulses on the CC terminal pin 21*b* (FIG. 3) which are detected by the second device (not shown) which is connected to the cable 201. These pulses are part of a handshaking process between the device 100 and the second device (not shown). Within the device 100 the handshaking is conducted by the communication interface circuit 10.

According to the USB Type-C standard a series of pulses are always output on the CC terminal pin 21*b* (FIG. 3) when no plug 200 is inserted into the receptacle 20. However, in contrast, according to teachings of the present disclosure, pulses are not output on the CC terminal pin 21*b* (FIG. 3) when no plug 200 is inserted into the receptacle 20. According to teachings of the present disclosure when no plug 200 is inserted into the receptacle 20, another terminal pin, suitably GND1 21*a* (FIG. 3) of the receptacle 20 is used to output pulses that have significantly lower energy than the handshaking pulses that are output on the CC terminal 21*b* (FIG. 3). When an inserted plug is detected using the lower energy pulses, the device 100 ceases to output the lower energy pulses and commences outputting the hand shaking/authentication pulses on the CC terminal pin 21*b* (FIG. 3) and establishes communication with the second device (not shown) that is connected via the cable 201.

Figure 2:
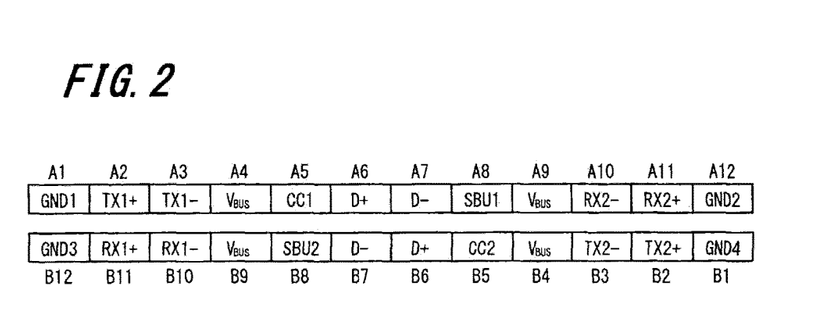
FIG. 2 is a pin assignment diagram for the receptacle and mating plug of the system shown in FIG. 1 according to an exemplary embodiment of the disclosure.

FIG. 2 is a pin assignment diagram for the receptacle 20 and mating plug 200 of the system shown in FIG. 1 according to an exemplary embodiment of the disclosure. The pin assignments shown in FIG. 2 correspond to the USB Type-C standard. As shown in FIG. 2 the receptacle 20 and mating plug 200 conforming to the USB Type-C standard include two CC terminals including a first CC1 at position A5 and a second CC2 at position B5. In the case of the receptacle 20, the pins at the top of FIG. 2 in the letter A prefixed positions are formed on one side of the substrate 21 and the pins at the bottom of FIG. 2 in the letter B prefixed positions are formed on the bottom side of the substrate 21. The complete pin assignments are as follows:

A1: 1st GND terminal pin
A2: 1st Tx+terminal pin
A3: 1st Tx−terminal pin
A4: VBUS terminal pin
A5: The 1st CC terminal pin
A6: D+terminal pin
A7: D−terminal pin
A8: 1st SBU terminal pin
A9: VBUS terminal pin
A10: 2nd Rx+terminal pin
A11: 2nd Rx−terminal pin
A12: 2nd GND terminal pin
B1: 4th GND terminal pin
B2: 2nd Tx+terminal pin
B3: 2nd Tx−terminal pin
B4: VBUS terminal pin
B5: The 2nd CC terminal pin
B6: D+terminal pin
B7: D−terminal pin
B8: 2nd SBU terminal pin
B9: VBUS terminal pin
B10: 1st Rx−terminal pin
B11: 1st Rx+terminal pin
B12: 3rd GND terminal pin In reference to FIG. 2 it is noted that with the exception of distinguishing numbering labels the pin arrangement can be rotated 180 degrees without changing the function of the pin at each location, and therefore a USB Type-C plug can be inserted into the receptacle 20 in either of two orientations. It should be noted that pins that are only distinguished by number labels such that for example TX1+ and TX2+ are fungible. Thus plugs conforming to the USB Type C standard, unlike plugs conforming to older USB standards, can be inserted up-side-down or right-side-up, there being no functional difference.

FIG. 3 is an electrical schematic showing elements of an interface between the receptacle 20 and plug 200 shown in FIGS. 1-2 according to an exemplary embodiment of the disclosure. The communication interface circuit 10 is shown at the left side of FIG. 3 and the receptacle 20 is shown at the right side of FIG. 3. The communication interface circuit 10 includes a controller 11, an analog-to-digital converter (A/D) 13, and a Configuration Channel (CC) processor 12. The controller 11 includes a first output 302 that is used for outputting low energy pulses coupled to a first terminal 14*a* of the communication interface circuit 10. The controller 11 includes a second output 304 that is used to output a GND Enable signal to a second terminal 14*b* of the communication interface circuit 10. The A/D 13 includes an analog input 306 coupled to a third terminal 14*c* of the communication interface circuit 10. The A/D 13 further includes a digital output 312 coupled to the controller 11. An Input/Output (I/O) pin 308 of the CC processor 12 is coupled to a fourth terminal 14d of the communication interface circuit 10. The controller 11 and the CC processor 12 can be implemented using a microprocessor, a microcontroller, a Field Programmable Gate Array (FPGA), an Application Specific Integrated Circuit (ASIC) and/or lower scale integration logic circuitry.

A voltage divider made up of a first resistor Ra and a second resistor Rb is coupled between the first terminal 14a of the communication interface circuit 10 and a ground plane 310 of the device 100. The first resistor Ra is connected directly to the first terminal 14a of the communication interface circuit 10 and the second resistor 14b is connected between the first resistor 14a and the ground plane 310. A junction of the first resistor Ra and the second resistor Rb is connected via a third resistor Rc to the third terminal 14c of the communication interface circuit 10 which in turn is coupled to the analog input 306 of the A/D 13. The resistor Rc serves to protect the A/D 13 from electrical stress such as electrostatic discharge that may be coupled from the terminal 21a. However, if the A/D 13 is designed to withstand such stress, Rc is not needed. The junction of the first resistor Ra and the second transistor Rb is also coupled to the first ground terminal pin GND1 21a of the receptacle 20. The gate of a transistor Q1 is coupled to the second terminal 14b of the communication interface circuit 10 and thereby receives the GND Enable signal produced by the controller 11 and output on second output 304 of the controller 11. The gate serves as a control terminal of the transistor which itself serves as a switch. The drain of the transistor Q1 is coupled to a first ground terminal GND1 21a (see also FIG. 2) which is directly coupled to the junction of the first resistor Ra and the second resistor Rb. The source of the transistor Q1 is coupled to the ground plane 310 of the device 100. Thus based on the aforementioned GND enable signal that is output at the second output 304 of the controller 11 the first ground terminal pin GND1 21a can be selectively connected to the ground plane 310 of the device 100 or disconnected therefrom. The CC1 terminal (identified by reference numeral 21b in FIG. 3) of the receptacle 20 is also shown in FIG. 3. Other terminals of the receptacle 20 which are shown in FIG. 2 are omitted in FIG. 3 in order to focus on certain specific aspects and to avoid crowding the drawing.

In operation, when the state of the GND enable signal is set to a state to turn off the transistor Q1, the controller 11 outputs low energy pulses at the first output 302 and through first terminal 14a. These pulses impress a voltage across the voltage divider formed by the first resistor Ra and the second resistor Rb. If a conductive liquid (e.g., water, juice, sea water) has intruded into the receptacle, the conductive liquid will be in parallel with the second resistor Rb, thereby lowering the voltage at the junction of the first resistor Ra and the second resistor Rb. The lowered voltage can be sensed synchronously (concurrently) with the pulses by the A/D 13 and used to infer the presence of the conductive liquid. Also if the plug 200 has been inserted into the receptacle 20 a path to ground through the plug's 200 GND1 contact will also lower the voltage at the junction between the first resistor Ra and the second resistor Rb and be sensed by the A/D 13. The case of liquid intrusion and plug insertion can be distinguished by the amount of voltage drop. The controller 11 is also coupled to a system bus 920 (FIG. 9) of the device 100 and through the system bus can also be coupled to the touch screen 101. The controller 101 can cause a warning message to be displayed on the touch screen 101 when a liquid is detected in the receptacle 20.

Figure 4:
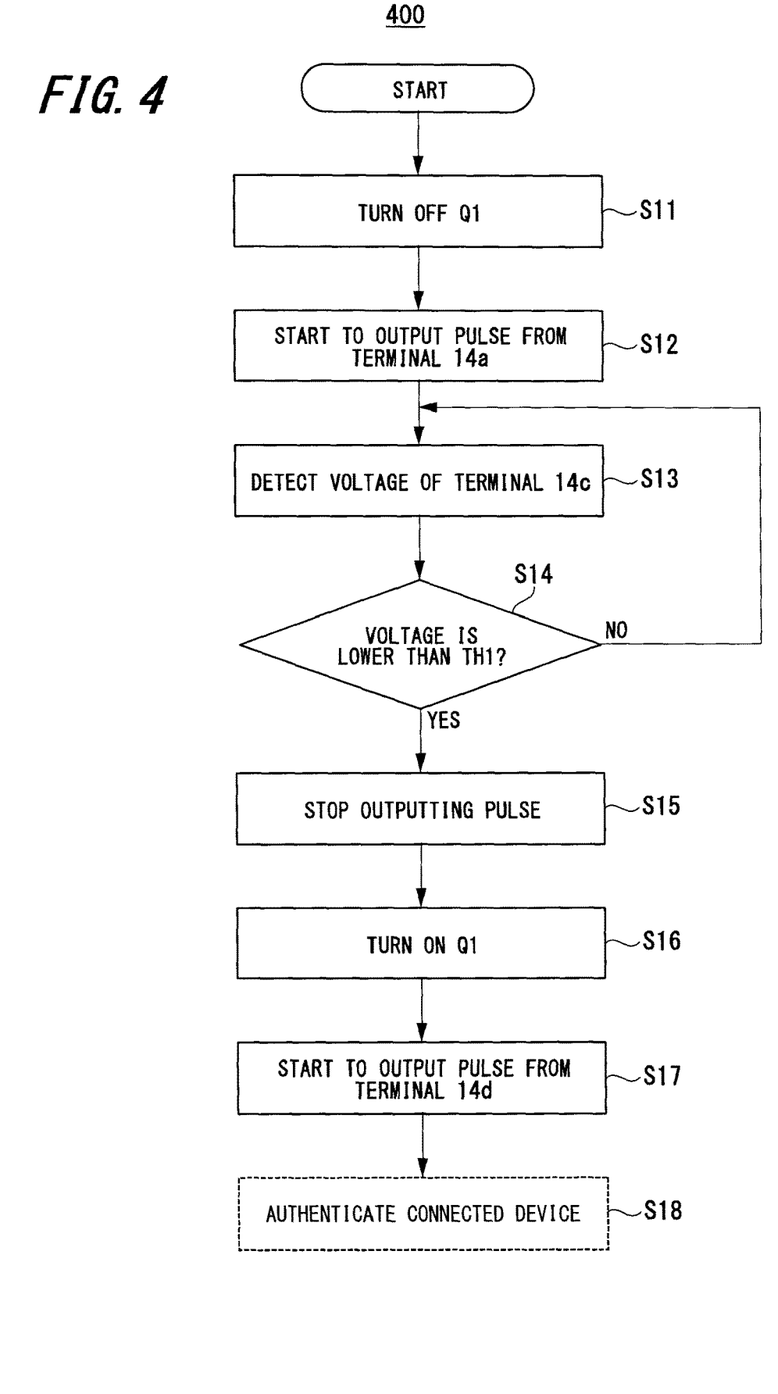
FIG. 4 is a flowchart of a method of handshaking between the receptacle and the plug depicted in FIGS. 1-3 according to an exemplary embodiment of the disclosure.

FIG. 4 is a flowchart of a method 400 of handshaking between the receptacle and the plug depicted in FIGS. 1-3 according to an exemplary embodiment of the disclosure. The steps of FIG. 4 correspond to an algorithm that is executed by, at least, the communication interface circuit 10 but it can also be executed by a combination of one or more circuitry or hardware elements of the device 100. In step S11 transistor Q1 is turned off by the controller 11 so that the second resistor Rb is not bypassed by a low impedance path to ground through the transistor Q1. In this state the first resistor Ra and the second resistor Rb can effectively function as a voltage divider. When the plug 200 is inserted into the receptacle 20 it will provide a high conductance pathway in parallel with the second resistor Rb effectively zeroing the voltage at the junction of the two resistors Ra, Rb.

In step S12 the controller 11 outputs a series of low energy pulses through the first output 302. The average power of the signal including the low energy pulses is low. The pulses are applied to the aforementioned voltage divider formed by the first resistor Ra and the second resistor Rb. In step S13 the voltage at the third terminal 14c of the communication interface circuit 10 is sensed using the A/D 13. The voltage at the third terminal 14c of the communication interface circuit 10 is nearly equal to the voltage at the junction between the first resistor Ra and the second resistor Rb due to the relatively high input resistance of the A/D 13. Next, at decision block S14 the controller 11 which receives the sensed voltage from the A/D 13 tests if the voltage at the third terminal 14c of the communication interface circuit 10 is lower than a stored threshold voltage value denoted TH1. A low voltage would indicate that some conductance provided by a liquid or the plug 200 in the receptacle 20 is bypassing the second resistor Rb. However the threshold value TH1 can be set to a value below a reduced voltage level that would occur even in the case of a highly conductive liquid such as sea water being present in the receptacle 20 and in this way the presence of the mating plug 200 and the presence of liquid in the receptacle 20 can be distinguished. If the outcome of decision block is negative, meaning that the voltage is equal to or higher than the stored threshold TH1, then the method loops back to step S13 and continues checking the voltage at the third terminal 14c of the communication interface circuit 10. If on the other hand the outcome of decision block S14 is positive meaning that voltage at the third terminal 14c of the communication interface circuit 10 is below the threshold and implying that the plug 200 is inserted into the receptacle (in the case that TH1 is set so low that the voltage would not drop below it unless the plug were inserted), then the method proceeds to step S15. In step S15 the controller 11 ceases outputting the series of low energy pulses that was commenced in step S12. Next in block S16 the transistor Q1 is turned on thereby connecting the first ground terminal pin GND1 21a to the ground plane 310 of the device 100 which is the appropriate state for normal use of the receptacle 20. The transistor Q1 serves to connect the ground terminal pin to the ground plane 310 of the device 100, however in certain cases the second device (not shown) which is connected via the plug 200 and receptacle 20 can provide a path to ground and the transistor Q1 is not needed. Next in step S17 the configuration channel processor 12 starts to output a sequence of handshaking pulses from the I/O pin 308 which is coupled through the fourth terminal pin 14d of the communication interface circuit 10 to the CC1 terminal pin 21b of the receptacle 20. The series of pulses output from the I/O pin 308 are part of a handshaking procedure for authenticating a second device (not shown) that is connected to the receptacle 20 via the mating plug 20 and cable 201. In step S18, which is optional, the device 100 completes authentication of the connected second device.

Figure 5:
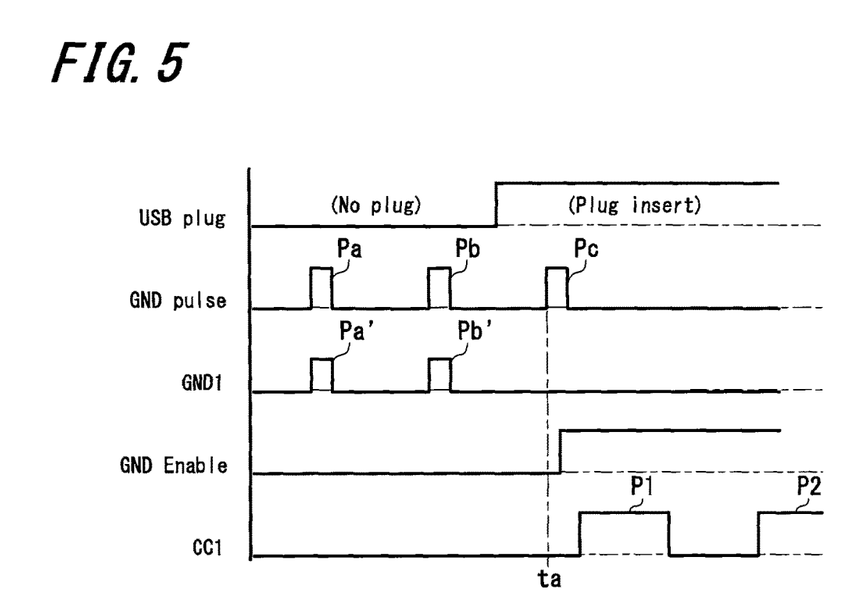
FIG. 5 shows a plot of a plug insertion state along with a sequence of plots of electrical signals produced while interfacing the receptacle and plug depicted in FIGS. 1-3 per the procedure depicted in FIG. 4 according to exemplary embodiments of the disclosure.

FIG. 5 shows a plot of a plug insertion state along with a sequence of plots of electrical signals produced while interfacing the receptacle 20 and plug 200 depicted in FIGS. 1-3 per the method depicted in FIG. 4 according to exemplary embodiments of the disclosure. Proceeding from top to bottom, the first plot labeled 'USB plug' shows the state of insertion of the plug 200 into the receptacle 20. This state is low initially when the plug 200 has not been inserted into the receptacle 20 and subsequently transitions to high when the plug 200 is inserted into the receptacle 20. The next plot labeled 'GND pulse' shows the relatively low energy ground pulses output at the first output 302 of the controller 11. Three pulses labeled Pa, Pb, and Pc are shown in the GND pulse plot. The next plot labeled 'GND1' shows the voltage at the GND1 terminal 21a. The GND1 plot includes two pulses labeled Pa' and Pb'. Note that initially with the transistor Q1 turned off the first resistor Ra and the second resistor Rb divide the voltage output at the first output 302 of the controller 11 so that Pa' and Pb' are a fraction of Pa and Pb. When the plug 200 is inserted at the time indicated in the USB plug plot of FIG. 5 the inserted plug provides a low impedance path in parallel with the second resistor Rb and the magnitude of pulse Pc divided by the first resistor Ra and the second resistor Rb now in parallel with a low resistor path through the mating plug 200 is substantially zeroed, so that there is no pulse corresponding to Pc in the GND1 plot. Once the controller 302 detects the zeroing of the voltage of the pulse level at terminal GND1 through the use of the A/D 13, the controller sets the GND enable signal high as shown in the fourth plot of FIG. 5. The GND enable signal turns on the transistor Q1. Thereafter, the controller 302 configures the communication interface circuit 10 to start outputting the handshaking signal on the CC1 terminal 21b, which is shown in the fifth plot of FIG. 5 labeled 'CC1'.

According to certain embodiments the relatively low power signal (compared to the hand shaking signal output on CC1) that includes pulses Pa, Pb, Pc that is output by the controller 11 and coupled to the ground terminal pin GND1 has a duty cycle of less than 0.1%. For example according to one exemplary embodiment the aforementioned pulses have a duration of 500 microseconds and the interval between pulses is 2 seconds. By comparison the pulses of the handshaking signal output at the CC1 terminal 21b typically have a duration of 50 milliseconds and a repetition period of 100 milliseconds giving a duty cycle of 50. In order to avoid the issue of electrochemically driven corrosion it is important that the pulse signal output by the ground terminal pin GND1 has an average power level that is a small fraction, in some embodiments less than 1/100, of the average power level of the handshaking signal that is output at the CC1 terminal 21b. In certain embodiments the duty cycle of the signal output on the ground terminal pin GND1 is less than 1/4000 of a duty cycle output of the handshaking signal. Note that it is also helpful in limiting the electrochemical corrosion to limit the voltage of the pulses Pa, Pb, Pc. In addition to being useful in detecting whether a liquid has intruded into the receptacle 20 and whether the mating plug 200 has been inserted into the receptacle 20 the voltage divider made up of the first resistor Ra and the second resistor Rb also serves to reduce the voltage of the relatively low power signal thereby tending to reduce the rate of electrochemically driven oxidation of the receptacle 20. In certain embodiments the voltage of the pulses Pa', Pb', Pc' are less than 1/3 of the voltage of the handshaking signal that is output at the CC1 terminal 21b. For example the voltage of the pulses Pa', Pb', Pc' can be set to 1.0 volt while the voltage of the handshaking signal can be set to 3.0 volts.

FIG. 6 is a block diagram of the device shown in FIG. 1 including a modified version of FIG. 3 depicting a state in which a liquid with a finite conductivity has intruded inside the receptacle. The liquid is represented by a resistance Rw between the first ground terminal pin GND1 21a and the second ground terminal pin GND2 21c of the receptacle. The second ground terminal pin GND2 21c is also connected to the ground plane 310 of the device 100. In certain cases a metal outer shell (not shown) of the receptacle is connected to the ground plane 310 of the device 100 and the liquid can also form a conductive path between the ground terminal pin GND1, 21a and the metal outer shell. The liquid with resistance Rw is in parallel with the second resistor Rb and therefore lowers the voltage at the junction of the first resistor Ra and the second resistor Rb and lowers the voltage sensed by the A/D 13. The amount of drop depends on the resistance of the liquid Rw. The voltage measured at the input 306 of the A/D 13 (for an exemplary embodiment) for different liquids is shown in the table below.

| Liquid | Voltage |
| --- | --- |
| NONE | 1.08 V |
| Water | 1.078 V |
| Juice | 1.018 V |
| Sea Water | 0.675 V |

In certain implementations it will be assumed that sea water is the lowest resistance liquid that will intrude into the receptacle, and the voltage threshold TH1 used in the comparison step S14 shown in FIG. 4 and FIG. 8 will be set to a value below the voltage obtained with sea water, in order to distinguish the case of the mating plug being inserted into the receptacle 20 from the case of a liquid being intruded into the receptacle 20. In the example on which the data obtained in the table is based the voltage obtained with sea water is 0.675 volts so in this case TH1 can be set to 0.6 volts for example. One skilled in the art will understand that the choice of voltage threshold is dependent on the values of the resistors Ra, Rb forming the voltage divider. The design of a particular connecter including the area and distance between metal surfaces that are shorted by the liquid will affect the voltages read with each liquid. A given receptacle equipped with a given voltage divider can be tested with different liquids to ascertain the resulting voltages and the threshold TH1 can then be set below the voltage obtained with the highest conductance liquid.

FIG. 9 shows other parts of the device 100 aside from the communication interface circuit 10 and the receptacle 20. Referring to FIG. 9, the device 100 further includes a system processor 902, a program memory 904, a workspace memory 906, one or more transceivers 908, a speaker driver 910, a display driver 912, a touch sensor interface 914, a microphone A/D 916, a vibration motor driver 919, and an indicator light driver 918 communicatively coupled together through a system bus 920. The one or more transceivers 908 are coupled to one or more antennas 922 which serve as free space medium interfaces. The speaker driver 910 is coupled to a speaker 924. The display driver 912 is drivingly coupled to a display 926. The touch sensor interface 914 is coupled to a transparent touch sensor 928 that overlies the display.

The display 926 in combination with the touch sensor 928 make up the touch screen 101. The microphone A/D 916 is coupled to a microphone 930. The indicator light driver 918 is coupled to an indicator light 932. The vibration motor driver 919 is coupled to a vibration motor 934.

Figure 7:
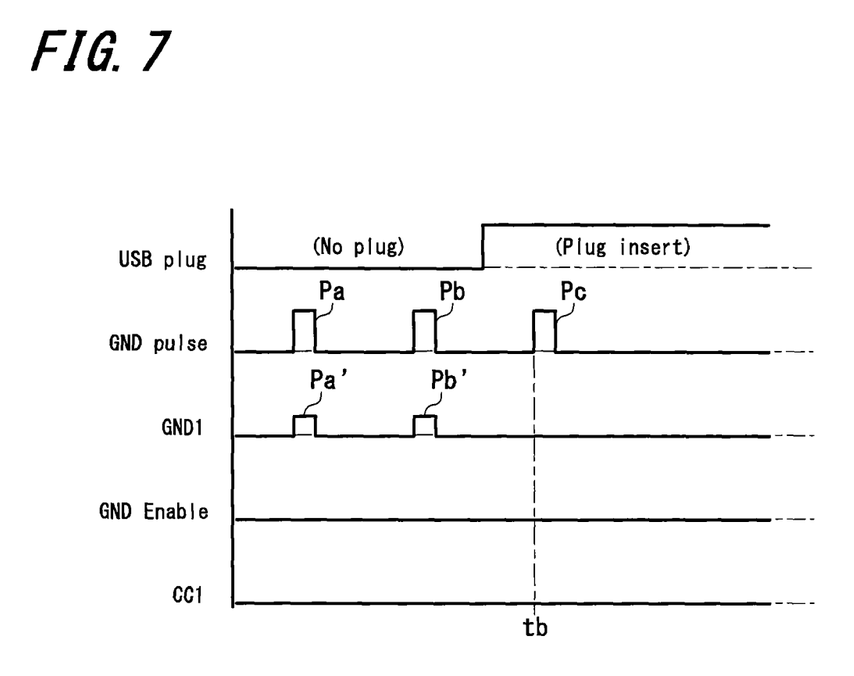
FIG. 7 shows a plot of a plug insertion state and a sequence of plots of electrical signals produced while interfacing the receptacle and plug depicted in FIGS. 1-3 in the case that a liquid with a finite conductivity has intruded inside the receptacle.

Conductive liquid that has intruded into the receptacle 20 can provide a conductive pathway in parallel with the second resistor Rb thereby lowering the voltage at the junction of the two resistors Ra, Rb. FIG. 7 shows a sequence of plots of electrical signals produced while interfacing the receptacle and plug depicted in FIGS. 1-3 in the case that a liquid with finite conductivity has intruded inside the receptacle. Referring to the GND1 plot which is the voltage on the first ground terminal, the pulses Pa' and Pb' are lower in this case than in the case of FIG. 5 due to the finite conductance of the liquid present in the receptacle 20. Having detected the presence of liquid by sensing the lower amplitude of the pulses Pa' and Pb', the device 100 does not enable the ground as shown in the GND Enable signal plot of FIG. 7 and does not generate the handshaking signal pulses as shown in the CC1 signal plot of FIG. 7. Rather, as discussed below in reference to FIG. 8 the device 100 will output a message through a user interface output (e.g., touch screen 101) instructing the user to remove the liquid from the receptacle.

Figure 8:
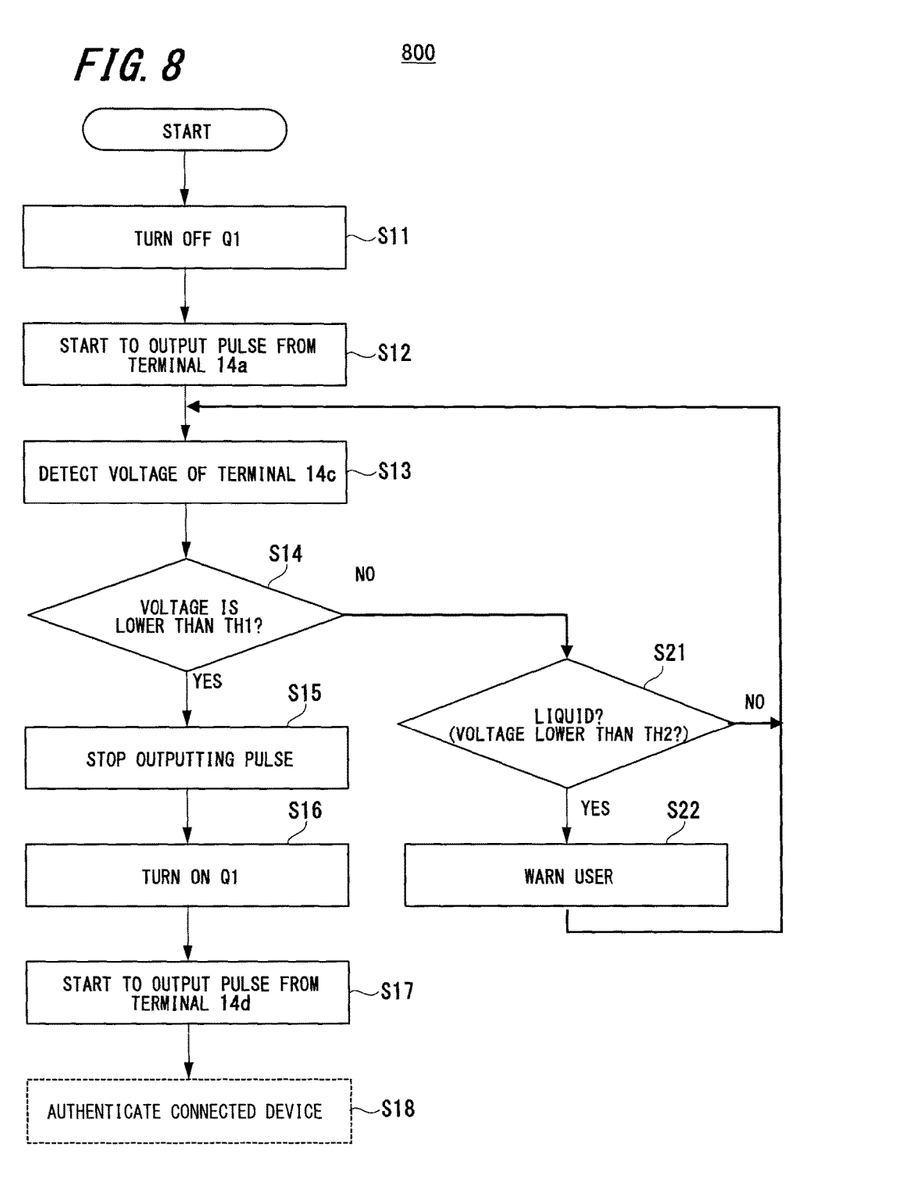
FIG. 8 is a flowchart of a method of handshaking between the receptacle and the plug depicted in FIGS. 1-3 and also of detecting and alerting a user to the presence of liquid in the receptacle.

FIG. 8 is a flowchart of a method 800 of handshaking between the receptacle 20 and the plug 200 depicted in FIGS. 1-3 and also of detecting and alerting a user to the presence of liquid in the receptacle 20. Steps S11 through S18 are the same as in FIG. 4 described above. Referring to FIG. 8 the method 800 differs from the method 400 in that if the outcome of decision block S14 is negative meaning that the voltage at terminal 14c (related to the voltage on the first ground terminal pin GND1 21a) is equal to or above the threshold, then rather loop back to step S13 and continuing to sense the voltage at terminal 14c, the method 800 branches to decision block S21 the outcome of which depends on whether a liquid has intruded into the receptacle 20. The outcome of decision block S21 can be decided by comparing the voltage detected by the A/D 13 to a second threshold TH2 which can be the voltage level for a dry, unconnected receptacle which as shown in the table above is 1.08 V. The second threshold can also be set to value (e.g., 1.079 volts) that is lower the voltage for a dry, unconnected receptacle by an incremental amount. The incremental amount can be chosen by a person of ordinary skill in the art based on the teachings herein and based on the resolution of the A/D 13 that is to be used, based on tolerance of the resistors that will be used, and based on the liquid with the least conductance (e.g., water) that the person of ordinary skill wants to detect. The voltage that is read by the A/D 13 can be read by the controller 11 and communicated to the system processor 902. If the voltage is below the second threshold TH2 then it will be inferred (e.g., by the system processor 902) that liquid is present in the receptacle 20 and if the voltage is not below the second threshold then it will be inferred (e.g., by the system processor) that liquid is not present in the receptacle 20. When the outcome of decision block S21 is negative meaning that liquid has not been detected in the receptacle 20 the method 800 loops back to block S13 and continues executing as described above. However, when the outcome of decision block S21 is positive meaning that liquid has been detected in the receptacle the method 800 continues with block S22 which outputs a warning message to a user about the presence of liquid in the receptacle 20. The warning is output through a user interface output such as the touch screen 101 (including the display 926), speaker 924, indicator light 932 and/or vibration motor 934. The warning can include an audio or text message such as "There is liquid in the USB receptacle, please dry it out." After outputting the warning, the method 800 loops back to block S13 and continues executing a previously described.

While certain embodiments have been described above with reference to the USB Type-C type plug, the teachings provided herein may be applied to other types as plugs. A pin (e.g., a ground pin) can be repurposed by decoupling it from circuit parts to which it is normally coupled (e.g., decoupling a ground pin from a ground plane) and a pulse that has power that is substantially lower than a handshaking signal can be output through the repurposed pin in order to sense the presence of a mating connector or a liquid. In the case that a liquid is sensed a warning can be output and in the case that a mating connector is detector the repurposed pin can be reinstated to its original function by recoupling it to circuit parts that it is normally coupled (e.g., by recoupling the ground pin to the ground plane) and thereafter the handshaking signal can be output through a second pin that is reserved for that purpose. Thus the teachings provided herein are applicable to connectors conforming to standards other than USB Type-C.

The power of the low power signal can be made lower than the handshaking signal by varying any subset or all of the voltage, pulse width and pulse repetition period.

Additionally the voltages mentioned above are merely examples and other voltages could be selected by a person of ordinary skill in the art based on the teachings herein.

Thus, the foregoing discussion discloses and describes merely exemplary embodiments of the present invention. As will be understood by those skilled in the art, the present invention may be embodied in other specific forms without departing from the spirit or essential characteristics thereof Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:
1. A device comprising:
an electrical connector including a plurality of terminal pins including a ground terminal pin and a handshaking signal terminal pin;
circuitry coupled to the ground terminal pin and the handshaking signal terminal pin, wherein the circuitry is configured to apply a sensing signal having a first voltage to the ground terminal pin and output a handshaking signal having a second voltage higher than the first voltage to the handshaking signal terminal pin, and the circuitry is further configured to sense a voltage level coupled from the ground terminal pin that is produced in response to the sensing signal and to output of the handshaking signal after sensing that the voltage level coupled from the ground terminal pin is below a first predetermined threshold.

2. The device according to claim 1 wherein the electrical connector comprises a receptacle.

3. The device according to claim 1 wherein the device further comprises a ground plane and the circuitry is further configured to couple the ground terminal pin to the ground plane after sensing that the voltage level coupled from the ground terminal is below the first predetermined threshold.

4. The device according to claim 1 further comprising an output device and wherein the circuitry is further configured to output a warning through the output device indicating that a liquid has intruded into the connector when the voltage level coupled from the ground terminal is not below the first predetermined threshold and is below a second predetermined threshold that is greater than the first predetermined threshold.

5. The device according to claim 1 wherein the sensing signal has a first duty cycle and the handshaking signal has a second duty cycle and the first duty cycle is less than the second duty cycle.

6. The device according to claim 1 wherein the sensing signal has a first average power and the handshaking signal has a second average power and the first average power is less than the second average power.

7. The device according to claim 1 wherein the circuitry comprises:
a source of the sensing signal;
a voltage divider coupled to the source of the sensing signal and coupled to the ground terminal pin.

8. The device according to claim 7 wherein the device further comprises:
a ground plane; and
the voltage divider comprises:
a first resistor and a second resistor coupled in series between the source of the sensing signal and the ground plane.

9. The device according to claim 8 wherein
a junction between the first resistor and the second resistor is coupled to the ground terminal pin.

10. The device according to claim 9 wherein the junction between the first resistor and the second resistor is coupled to a voltage sensing device.

11. The device according to claim 10 wherein the voltage sensing device comprises an analog-to-digital converter.

12. The device according to claim 11 wherein the analog-to-digital converter is coupled to the junction between the first resistor and the second resistor by a third resistor.

13. The device according to claim 10 further comprising a switch device coupled between the junction of the first resistor and the second resistor and a ground plane of the device.

14. The device according to claim 10 wherein the switch device comprises a transistor.

15. A device comprising:
an output device;
an electrical connector including a terminal pin;
circuitry coupled to the terminal pin, wherein the circuitry is configured to couple a sensing signal to the terminal pin, the sensing signal having a voltage that is lower than voltage of a handshaking signal output by the circuitry, and to sense a voltage level coupled from the terminal pin that is produced in response to the sensing signal and is further adapted to output a warning through the output device indicating a liquid having intruded into the electrical connector when the voltage level coupled from the terminal is between a predetermined lower voltage and a predetermined upper voltage.

16. The device according to claim 15 wherein the electrical connector comprises a receptacle configured to receive a plug.

17. The device according to claim 15 wherein:
the terminal pin is a ground terminal pin;
the circuitry further comprises: a controller, a ground plane and a switch, the switch comprising a control terminal for controlling a state of the switch;
the ground terminal pin is coupled to the ground plane through the switch;
the controller is coupled to the control terminal of the switch; and
the controller is configured to close the switch when the voltage level coupled from the terminal is below the predetermined lower voltage.

18. A method of operating a device that includes an electrical connector, the method comprising:
a method of sensing liquid in the electrical connector, the method of sensing including:
opening, using circuitry, a switch between a ground terminal pin of the connector and a ground plane;
coupling, using the circuitry, a sensing signal to the ground terminal pin, the sensing signal having a voltage that is lower than voltage of a handshaking signal output by the circuitry;
measuring, using the circuitry, a voltage on the ground terminal pin concurrent with coupling the sensing signal to the ground terminal pin; and
checking, using the circuitry, if the voltage on the ground terminal pin is between a predetermined lower voltage and a predetermined upper voltage.

19. The method of operating the device recited in claim 18 further comprising:
closing the switch between the ground terminal pin of the connector and the ground plane after sensing that the voltage on the ground terminal pin is below the lower voltage.

20. The method of operating the device recited in claim 18 further comprising:
outputting a warning through a user interface output about a liquid having intruded into the electrical connector when the voltage on the ground terminal pin is between the predetermined lower voltage and the predetermined upper voltage.

* * * * *